(12) United States Patent
Veerasamy

(10) Patent No.: US 7,988,836 B2
(45) Date of Patent: *Aug. 2, 2011

(54) METHOD OF MAKING WINDOW UNIT INCLUDING DIAMOND-LIKE CARBON (DLC) COATING

(75) Inventor: Vijayen S. Veerasamy, Farmington Hills, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/588,342

(22) Filed: Oct. 13, 2009

(65) Prior Publication Data

US 2010/0032287 A1     Feb. 11, 2010

Related U.S. Application Data

(63) Continuation of application No. 10/891,187, filed on Jul. 15, 2004, now Pat. No. 7,622,161, which is a continuation of application No. 10/091,589, filed on Mar. 7, 2002, now Pat. No. 6,827,977.

(51) Int. Cl.

| | |
|---|---|
| *C23C 14/00* | (2006.01) |
| *C23C 14/32* | (2006.01) |
| *C23C 16/00* | (2006.01) |
| *C23C 16/26* | (2006.01) |
| *C23C 16/06* | (2006.01) |
| *C23C 14/14* | (2006.01) |
| *C23C 14/16* | (2006.01) |
| *C23C 14/08* | (2006.01) |
| *B05D 5/06* | (2006.01) |
| *B05D 3/02* | (2006.01) |
| *C03C 17/00* | (2006.01) |
| *G02B 1/10* | (2006.01) |

(52) U.S. Cl. ......... 204/192.26; 204/192.27; 204/192.28; 427/162; 427/163.1; 427/165; 427/249.1; 427/249.7; 427/255.11; 427/255.36; 427/376.1; 427/523; 427/527; 427/529; 427/530

(58) Field of Classification Search ............. 204/192.11, 204/192.27, 192.3, 192.26, 192.28; 427/162, 427/163.1, 165, 249.1, 249.7, 255.11, 255.36, 427/376.1, 523, 527, 529, 530

See application file for complete search history.

(56) References Cited

U.S. PATENT DOCUMENTS

| | | | |
|---|---|---|---|
| 4,898,790 | A | 2/1990 | Finley |
| 4,919,778 | A | 4/1990 | Dietrich et al. |
| 5,135,808 | A | 8/1992 | Kimock et al. |

(Continued)

FOREIGN PATENT DOCUMENTS

EP     0 605 814     7/1994

(Continued)

OTHER PUBLICATIONS

U.S. Appl. No. 10/891,187, filed Jul. 15, 2004; Veerasamy.

(Continued)

*Primary Examiner* — Alexa D Neckel
*Assistant Examiner* — Michael Band
(74) *Attorney, Agent, or Firm* — Nixon & Vanderhye P.C.

(57) ABSTRACT

A method of making a coated article (e.g., window unit), and corresponding coated article are provided. A layer of or including diamond-like carbon (DLC) is formed on a glass substrate. Then, a protective layer is formed on the substrate over the DLC inclusive layer. During heat treatment (HT), the protective layer prevents the DLC inclusive layer from significantly burning off. Thereafter, the resulting coated glass substrate may be used as desired, it having been HT and including the protective DLC inclusive layer.

9 Claims, 3 Drawing Sheets

U.S. PATENT DOCUMENTS

| | | | |
|---|---|---|---|
| 5,470,661 A | 11/1995 | Bailey et al. |
| 5,514,476 A | 5/1996 | Hartig et al. |
| 5,557,462 A | 9/1996 | Hartig et al. |
| 5,635,245 A | 6/1997 | Kimock et al. |
| 5,688,585 A | 11/1997 | Lingle et al. |
| 5,858,477 A | 1/1999 | Veerasamy et al. |
| 5,888,593 A | 3/1999 | Petrmichl et al. |
| 5,900,342 A | 5/1999 | Visser et al. |
| 5,965,246 A | 10/1999 | Guiselin et al. |
| 6,133,119 A | 10/2000 | Yamazaki |
| 6,261,672 B1 | 7/2001 | de Paoli |
| 6,261,693 B1 | 7/2001 | Veerasamy |
| 6,277,480 B1 | 8/2001 | Veerasamy et al. |
| 6,280,834 B1 | 8/2001 | Veerasamy et al. |
| 6,280,847 B1 | 8/2001 | Corkhill et al. |
| 6,284,377 B1 | 9/2001 | Veerasamy |
| 6,303,225 B1 | 10/2001 | Veerasamy |
| 6,303,226 B2 | 10/2001 | Veerasamy |
| 6,312,808 B1 | 11/2001 | Veerasamy et al. |
| 6,335,086 B1 | 1/2002 | Veerasamy |
| 6,338,901 B1 | 1/2002 | Veerasamy |
| 6,395,333 B2 | 5/2002 | Veerasamy |
| 6,451,434 B1 | 9/2002 | Ebisawa et al. |
| 6,475,573 B1 | 11/2002 | Veerasamy et al. |
| 6,491,987 B2 | 12/2002 | Veerasamy |
| 6,602,371 B2 | 8/2003 | Veerasamy |
| 6,663,753 B2 | 12/2003 | Veerasamy et al. |
| 6,740,211 B2 | 5/2004 | Thomsen et al. |
| 6,764,579 B2 | 7/2004 | Veerasamy et al. |
| 6,808,606 B2 | 10/2004 | Thomsen et al. |
| 6,827,977 B2 | 12/2004 | Veerasamy |
| 6,878,404 B2 | 4/2005 | Veerasamy et al. |
| 7,060,322 B2 | 6/2006 | Veerasamy |
| 7,067,175 B2 | 6/2006 | Veerasamy |
| 7,150,849 B2 | 12/2006 | Veerasamy |
| 7,229,533 B2 | 6/2007 | Veerasamy |
| 7,449,218 B2 | 11/2008 | Veerasamy |
| 7,501,148 B2 | 3/2009 | Veerasamy |
| 7,507,442 B2 | 3/2009 | Veerasamy |
| 7,622,161 B2 | 11/2009 | Veerasamy |
| 2003/0064198 A1 | 4/2003 | Thomsen et al. |
| 2003/0113551 A1 | 6/2003 | Thomsen et al. |
| 2007/0018887 A1 | 1/2007 | Feyereisen et al. |
| 2007/0254164 A1 | 11/2007 | Veerasamy |
| 2008/0020211 A1 | 1/2008 | Petrmichl et al. |

FOREIGN PATENT DOCUMENTS

| | | |
|---|---|---|
| EP | 07239444 A1 | 7/1996 |
| WO | WO 00/66506 | 11/2000 |
| WO | WO 02/38515 | 5/2002 |

OTHER PUBLICATIONS

"Highly tetrahedral, diamond-like amorphous hydrogenated carbon prepared from a plasma beam source", Weiler et al., May 23, 1994, No. 21, pp. 2797-2799.

"Optical and Electronic Properties of Amorphous Diamond", Veerasamy et al., 1993, pp. 782-787 Diamond and Related Materials, vol. 2, No. 5/7, Apr. 1993.

Properties of Ion Beam Deposited Tetrahedral Fluorinated Amorphous Carbon Films, Ronning et al., pp. 335-340.

"Preparation and Properties of Highly Tetrahedral Hydrogenated Amorphous Carbon", Weiler et al., Jan. 15, 1996, XP-000992913, pp. 1594-1608.

METHOD OF MAKING WINDOW UNIT INCLUDING DIAMOND-LIKE CARBON (DLC) COATING

This application is a continuation of application Ser. No. 10/891,187 filed Jul. 15, 2004, now U.S. Pat. No. 7,622,161 which is a continuation of 10/091,589 filed Mar. 7, 2002 (now U.S. Pat. No. 6,827,977), the entire contents of which are hereby incorporated herein by reference in this application.

This invention relates to a method of making a coated article to be used in a window unit or any other suitable application. For example, in certain embodiments this invention relates to a method of making a window unit (e.g., vehicle window such as vehicle windshield, backlite, sunroof, or sidelite, or IG window unit) including a step of heat treating a glass substrate coated with at least a layer comprising diamond-like carbon (DLC).

BACKGROUND OF THE INVENTION

Vehicle windows (e.g., windshields, backlites, sunroofs, and sidelites) are known in the art. For purposes of example, vehicle windshields typically include a pair of bent glass substrates laminated together via a polymer interlayer such as polyvinyl butyral (PVB). It is known that one of the two glass substrates may have a coating (e.g., low-E coating) thereon for solar control purposes such as reflecting IR and/or UV radiation, so that the vehicle interior can be more comfortable in certain weather conditions. Conventional vehicle windshields are made as follows. First and second flat glass substrates are provided, one of them optionally having a low-E coating sputtered thereon. The pair of glass substrates are washed and booked together (i.e., stacked on one another), and then while booked are heat bent together into the desired windshield shape at a high temperature(s) (e.g., 8 minutes at about 600-625 degrees C.). The two bent glass substrates are then laminated together via the polymer interlayer to form the vehicle windshield.

Insulating glass (IG) window units are also known in the art. Conventional IG window units include at least first and second glass substrates (one of which may have a solar control coating on an interior surface thereof) that are coupled to one another via at least one seal(s) or spacer(s). The resulting space or gap between the glass substrates may or may not be filled with gas and/or evacuated to a low pressure in different instances. However, many IG units are required to be tempered. Thermal tempering of the glass substrates for such IG units typically requires heating the glass substrates to temperature(s) of at least about 600 degrees C. for a sufficient period of time to enable thermal tempering.

Other types of coated articles also require heat treatment (HT) (e.g., tempering, heat bending, and/or heat strengthening) in certain applications. For example and without limitation, glass shower doors, glass table tops, and the like require HT in certain instances.

Diamond-like carbon (DLC) is sometimes known for its scratch resistant properties. For example, different types of DLC are discussed in the following U.S. Pat. Nos. 6,303,226; 6,303,225; 6,261,693; 6,338,901; 6,312,808; 6,280,834; 6,284,377; 6,335,086; 5,858,477; 5,635,245; 5,888,593; 5,135,808; 5,900,342; and 5,470,661, all of which are hereby incorporated herein by reference.

It would sometimes be desirable to provide a window unit with a protective coating including DLC in order to protect the window from scratches and the like. Unfortunately, DLC tends to burn off at temperatures of from approximately 380 to 400 degrees C., as the heat treatment is typically conducted in an atmosphere including oxygen. Thus, it will be appreciated that DLC as a protective overcoat cannot withstand the heat treatments (HT) at the extremely high temperatures described above which are often required in the manufacture of vehicle windows, IG window units, and/or the like.

Accordingly, those skilled in the art will appreciate that a need in the art exists for a method of providing heat treated (HT) windows with a protective coating (one or more layers) comprising DLC. A need for corresponding windows also exists.

BRIEF SUMMARY OF THE INVENTION

An object of this invention is to provide a method of making a coated article (e.g., window unit), including heat treatment (HT), wherein the coated article includes a coating (one or more layers) comprising diamond-like carbon (DLC).

Another object of certain example embodiments of this invention is to provide a method of making a coated article by (a) coating a glass substrate with a layer comprising DLC, then (b) forming a protective layer on the glass substrate over the DLC, and (c) heat treating the coated article with the DLC and the protective layer thereon with the protective layer preventing the DLC from burning off (in part or entirely) during the heat treatment. The resulting coated article may be used in the context of, for example and without limitation, vehicle windows, architectural windows, insulating glass (IG) window units, shower doors, glass table tops, and/or the like.

Another object of certain example embodiments of this invention is to provide a coated article (e.g., window unit) made in accordance with the above technique.

Another object of certain example embodiments of this invention is to fulfill one or more of the above-listed objects and/or needs.

In certain example embodiments of this invention, one or more of the above-listed objects and/or needs is/are fulfilled by providing a method of making an insulating glass (IG) window unit, the method comprising: providing a glass substrate; forming a layer comprising diamond-like carbon (DLC) on the glass substrate; forming a protective layer on the glass substrate over the layer comprising DLC; heat treating the glass substrate with the layer comprising DLC and the protective layer thereon so that during the heat treating the protective layer prevents significant burnoff of the layer comprising DLC, wherein the heat treating comprises heating the glass substrate to temperature(s) sufficient for thermal tempering; and after the heat treating, coupling the glass substrate with at least the layer comprising DLC thereon to another substrate in making the IG window unit.

In certain other example embodiments of this invention, one or more of the above-listed objects and/or needs is/are fulfilled by providing a method of making a vehicle windshield, the method comprising: providing a glass substrate; forming a layer comprising diamond-like carbon (DLC) on the glass substrate; forming a protective layer on the glass substrate over the layer comprising DLC; heat treating the glass substrate with the layer comprising DLC and the protective layer thereon, wherein the heat treating comprises heating the glass substrate to temperature(s) sufficient for bending the glass substrate; and after the heat treating, laminating the glass substrate with at least the layer comprising DLC thereon to another substrate via at least a polymer inclusive interlayer in making the vehicle windshield.

In still further example embodiments of this invention, one or more of the above-listed objects and/or needs may be fulfilled by providing method of making a coated article, the method comprising: providing a glass substrate; forming a layer comprising diamond-like carbon (DLC) on the glass substrate; forming a protective layer on the glass substrate over the layer comprising DLC; heat treating the glass substrate with the layer comprising DLC and the protective layer thereon, and wherein the heat treating comprises heating the glass substrate using at least temperature(s) of at least 580 degrees C. for at least one of bending and thermally tempering the glass substrate.

In yet other example embodiments of this invention, one or more of the above-listed objects and/or needs may be fulfilled by providing a coated article comprising: a glass substrate that is thermally tempered and/or bent; a layer comprising diamond-like carbon (DLC) supported by the glass substrate; and a protective layer comprising a carbide provided on the glass substrate over the layer comprising DLC. In certain example instances, the carbide may comprise at least one of: boron carbide, titanium carbide, hafnium carbide, titanium hafnium carbide, tantalum carbide, and zirconium carbide.

DETAILED DESCRIPTION OF THE INVENTION

Figure 1:
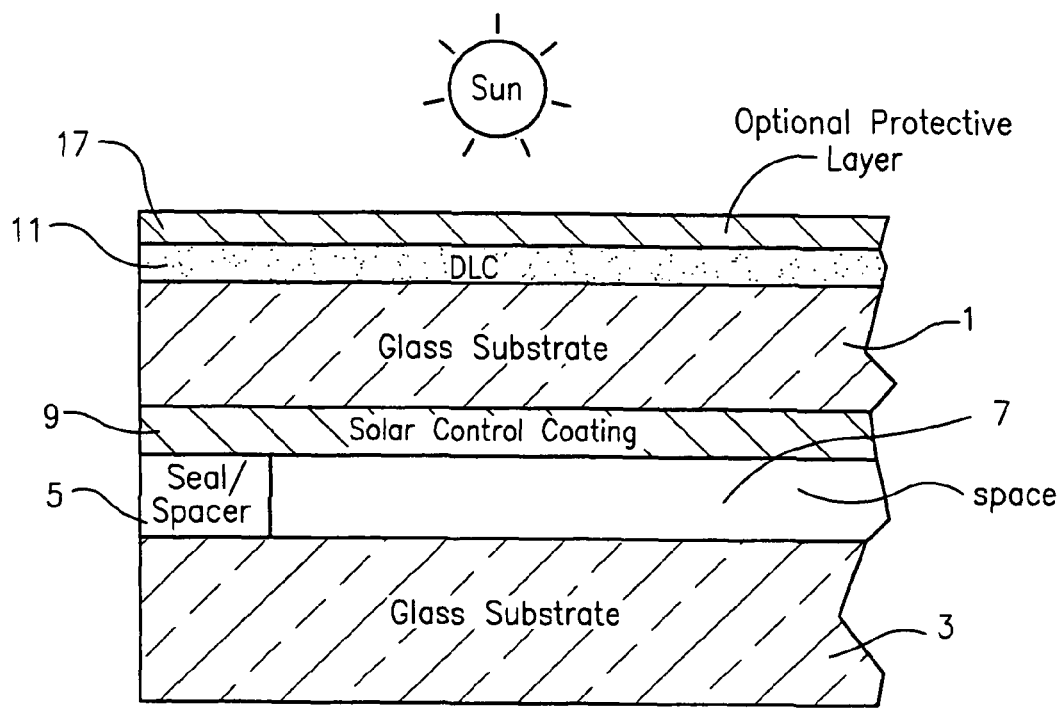
FIG. 1 is a cross sectional view of part of an insulating glass (IG) window unit according to an example embodiment of this invention.

Referring now more particularly to the accompanying drawings in which like reference numerals indicate like parts throughout the several views.

Certain example embodiments of this invention relate to methods of making coated articles that require heat treatment (HT), so as to include a protective coating (one or more layers) including diamond-like carbon (DLC). In certain instances, the HT may require heating a supporting glass substrate, with the DLC thereon, to temperature(s) of from 550 to 800 degrees C., more preferably from 580 to 800 degrees C. (which is well above the burn-off temperature of DLC). In particular, certain example embodiments of this invention relate to a technique for enabling the DLC to withstand such HT without significantly burning off during the same. In certain embodiments a protective layer is formed on the glass substrate over the DLC so as to reduce the likelihood of the DLC burning off during HT. Thus, much if not all of the DLC remains on the glass substrate, and does not burn off, during the HT. Following HT, the protective layer may or may not be removed (e.g., via etching or any other suitable technique) in different embodiments of this invention.

FIG. 1 is a cross sectional view of part of an insulating glass (IG) window unit according to an example embodiment of this invention. The IG window unit includes first glass substrate 1 and second glass substrate 3 which are sealed together and/or spaced from one another via one or more spacers/seals 5. The gap or space 7 defined between the opposing substrates 1 and 3 may or may not be filled with gas (e.g., Ar) and may or may not be evacuated to a pressure lower than atmospheric in different embodiments of this invention. Glass substrate(s) 1 and/or 3 may be soda-lime-silica glass (e.g., made via the known float process), or any other suitable type of glass (e.g., borosilicate glass) in different embodiments of this invention. Each substrate 1, 3 may be from about 1 to 10 mm thick, more preferably from 2 to 5 mm thick, and most preferably from about 2.5 to 3.6 mm thick in certain example embodiments of this invention.

Still referring to FIG. 1, optionally, substrate 1 and/or 3 may have a solar control coating (e.g., multi-layer low-E coating) 9 provided on an interior surface thereof facing the other substrate. For example and without limitation, the solar control coating may include any of the coatings in any of U.S. Pat. Nos. 5,688,585, 5,557,462, 4,898,790, 5,514,476, 3,682,528, 5,376,455, 5,377,045, 5,514,476, 5,770,321, 5,902,505, 5,942,338, 6,059,909, 6,060,178, 6,132,881, or 6,159,607, or U.S. Ser. No. 09/794,224 (see WO 02/04375), all of which are hereby incorporated herein by reference. Many of these solar control coatings include at least one (and sometimes multiple) IR reflecting layer (e.g., including or of Ag and/or NiCr) sandwiched between a pair of dielectric layers; where the dielectric layers may or may not contact the Ag or NiCr. However, the instant invention is not so limited, and any other type of solar control coating 9 may instead be used in different instances. In certain example embodiments, coating 9 includes at least one layer for reflecting infrared (IR) radiation (e.g., a layer comprising one or more of Ag, Au, Ni, NiCr, or the like).

The IG window unit of FIG. 1, even after heat treatment (HT) such as thermal tempering of at least coated glass substrate 1, further includes a coating (including one or more layers) including at least one layer 11 of or including diamond-like carbon (DLC) provided on the exterior surface of glass substrate 1. The layer 11 of or including DLC may or may not be doped in certain example embodiments of this invention (e.g., may or may not be doped with one or more of H, N, B, Si, and/or any other suitable dopant). For example and without limitation, the layer 11 of or including DLC may be any of the DLC inclusive layers of any of U.S. Pat. Nos. 6,303,226; 6,303,225; 6,261,693; 6,338,901; 6,312,808; 6,280,834; 6,284,377; 6,335,086; 5,858,477; 5,635,245; 5,888,593; 5,135,808; 5,900,342; or 5,470,661, or alternatively may be any other suitable type of DLC inclusive layer. DLC inclusive layer 11 may be hydrophobic (high contact angle), hydrophilic (low contact angle), or neither, in different embodiments of this invention.

DLC inclusive layer 11 may be from about 5 to 1,000 angstroms (Å) thick in certain example embodiments of this invention, more preferably from 10-300 Å thick. In certain example embodiments of this invention, layer 11 including DLC may have an average hardness of at least about 10 GPa, more preferably at least about 20 GPa, and most preferably from about 20-90 GPa. Such hardness renders layer (s) 11 resistant to scratching, certain solvents, and/or the like. Layer 11 may, in certain example embodiments, be of or include a special type of DLC known as highly tetrahedral amorphous carbon (t-aC), and may be hydrogenated (t-aC:H) in certain embodiments. This type of DLC includes more sp carbon-carbon (C—C) bonds than $sp^2$ carbon-carbon (C—C) bonds. In certain example embodiments, at least about 50% of the carbon-carbon bonds in the layer 11 may be $sp^3$ carbon-carbon (C—C) bonds, more preferably at least about 60% of the carbon-carbon bonds in the layer 11 may be $sp^3$ carbon-carbon (C—C) bonds, and most preferably at least about 70% of the carbon-carbon bonds in the layer 11 may be sp³ carbon-carbon (C—C) bonds. In certain example embodiments of this invention, the DLC may have a density of at least about 2.4 gm/cm³, more preferably of at least about 2.7 gm/cm³. Example linear ion beam sources that may be used to deposit DLC inclusive layer 11 on substrate 1 include any of those in any of U.S. Pat. Nos. 6,261,693, 6,002,208, 6,335,086, or 6,303,225 (all incorporated herein by reference). When using an ion beam source to deposit layer(s) 11, hydrocarbon feedstock gas(es) (e.g., $C_2H_2$), HMDSO, or any other suitable gas, may be used in the ion beam source in order to cause the source to emit an ion beam toward substrate 1 for forming layer(s) 11. It is noted that the hardness and/or density of layer(s) 11 may be adjusted by varying the ion energy of the depositing apparatus.

Coating 11 enables the IG unit of FIG. 1 to be more scratch resistant than if the coating 11 were not provided. It is noted that while coating 11 is on glass substrate 1 in certain embodiments of this invention, additional layer(s) may or may not be under coating 11 between the substrate 1 and coating 11 in certain example embodiments of this invention. Thus, the phrase "on the substrate" as used herein is not limited to being in direct contact with the substrate as other layer(s) may still be provided therebetween. However, in certain embodiments of this invention, carbon atoms and/or bonds of DLC inclusive layer 11 are subimplanted into the glass substrate 1 as discussed in U.S. Pat. Nos. 6,303,226 and/or 6,261,693. Moreover, as explained below, it is possible for additional layer(s) to be provided on the substrate 1 over DLC inclusive layer 11 in certain embodiments of this invention. As will be seen from the discussion below, protective layer 17 on the final window product is optional, although it is used in the manufacturing process.

In certain example embodiments of this invention, the IG window unit of FIG. 1 has a visible transmission of at least 50%, more preferably of at least 60%, and in some cases at least 70%.

Figure 2:
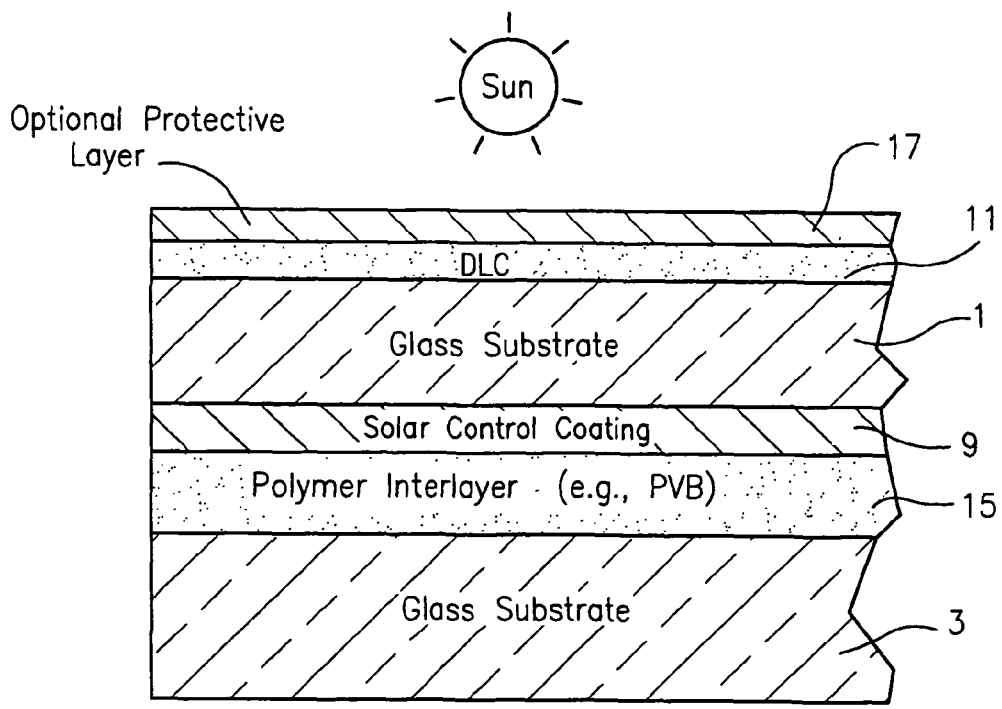
FIG. 2 is a cross sectional view of part of a laminated vehicle windshield according to another example embodiment of this invention.

FIG. 2 is a cross sectional view of an example vehicle windshield according to another embodiment of this invention. In the FIG. 2 embodiment, the glass substrates 1 and 3, solar control coating 9, DLC inclusive layer 11, and protective layer 17 are as described above with respect to the FIG. 1 embodiment. In windshield embodiments, glass substrates 1 and 3 are preferably heat bent to a desired curved shape(s) in a know manner via HT. After bending, the glass substrates are laminated to one another via a polymer inclusive interlayer 15. Polymer inclusive interlayer 15, provided for lamination purposes, may include PVB, polyurethane, ethylene-vinyl acetate (EVA), polyvinyl chloride (PVC), a polyester, polycarbonate, polypropylene, polyethylene, and/or polyurethacrylate, or the like in different embodiments of this invention. In certain windshield embodiments, the resulting windshield may have a visible transmission of at least 70%, an in some instances at least 75%.

Figure 3A:
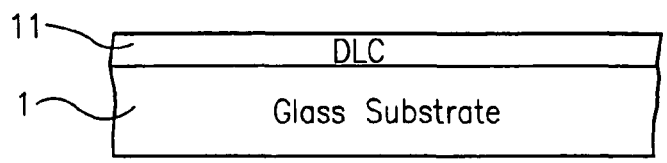
FIGS. 3(a)-3(d) illustrate steps taken according to an example embodiment of this invention in making either of the window units of FIGS. 1-2, or any other type of suitable coated article.
Figure 3B:
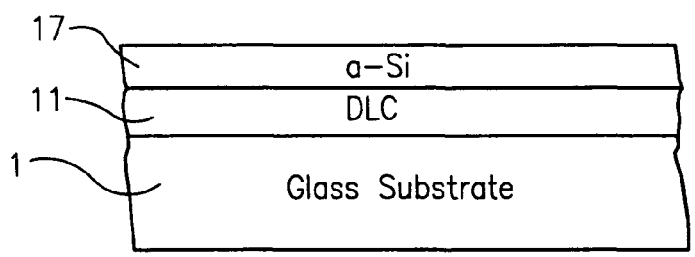
Figure 3C:
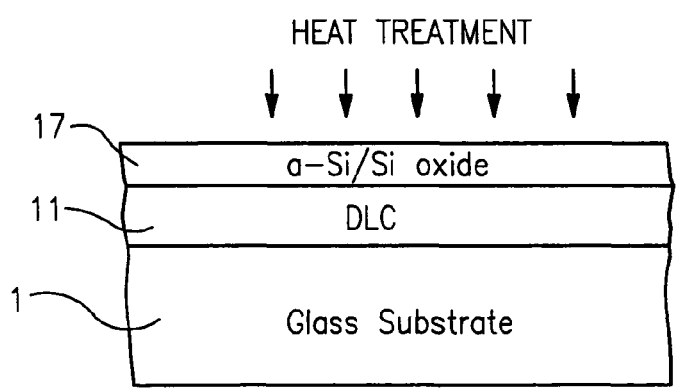
Figure 3D:
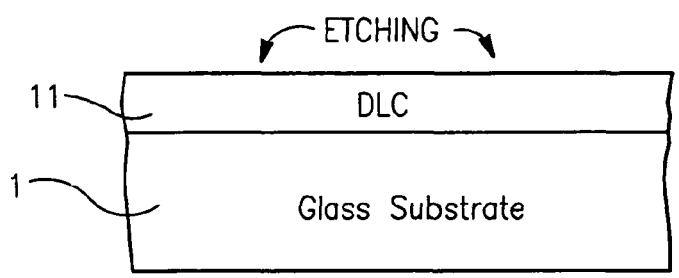
Figure 4:
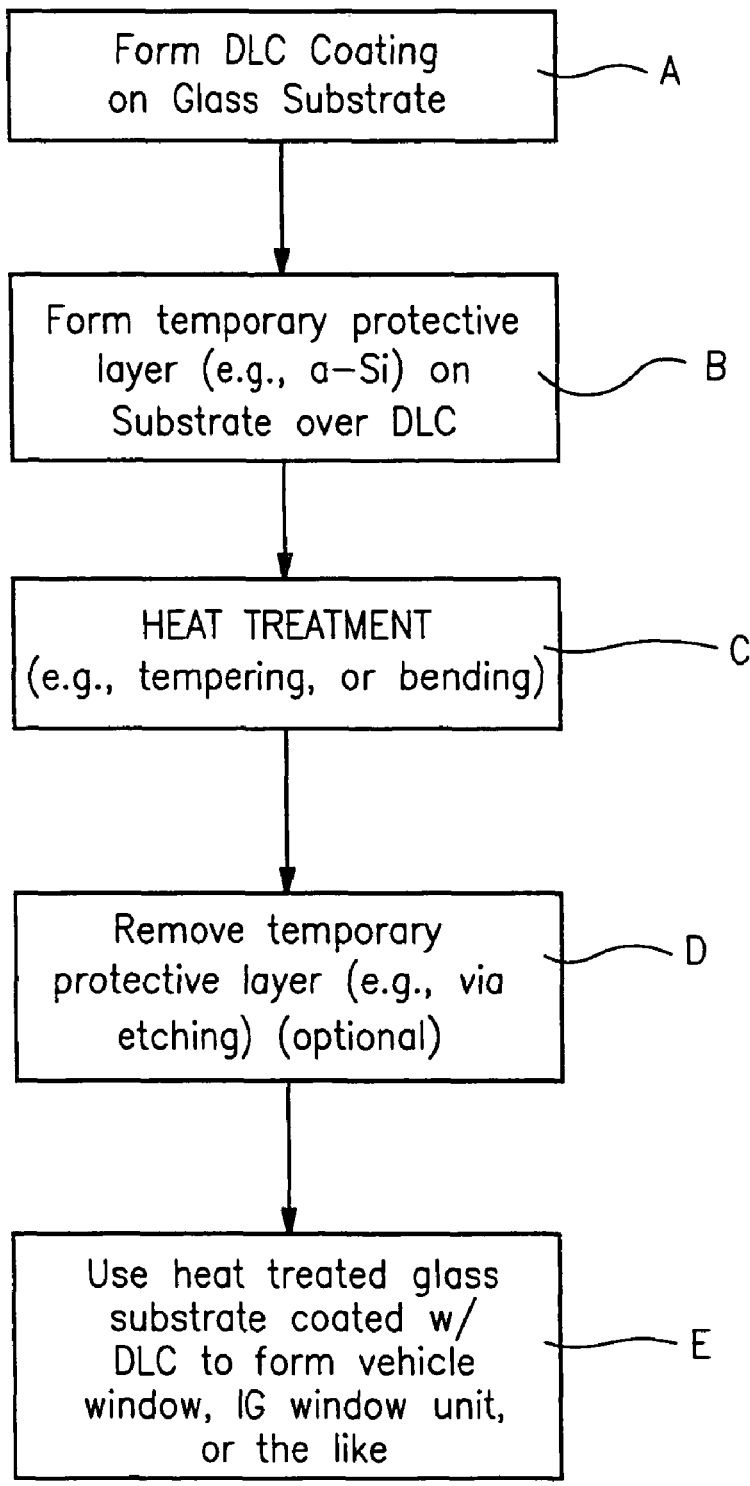
FIG. 4 is a flowchart illustrating steps taken according to an example embodiment of this invention in making either of the window units of FIGS. 1-2, or any other type of suitable coated article.

Referring to FIGS. 3-4, it will now be explained-how various coated articles according to different embodiments of this invention (e.g., the coated articles of FIGS. 1 and/or 2, or other types of coated articles) may be made.

Initially, glass substrate 1 is provided. Optionally, one or both surfaces of the glass substrate 1 may be ion beam milled to remove at least 2 Å of glass thickness therefrom. Optionally, a multi-layer solar control coating 9 may be deposited (e.g., via sputtering) on one side of the substrate 1. As shown in FIG. 3(a), one or more layer(s) 11 of or including DLC may then be deposited (e.g., via ion beam deposition) on the other side of the glass substrate 1 (see step A in FIG. 4). The DLC inclusive layer(s) 11 may be deposited either directly on glass substrate 1 so as to enable subimplantation into the glass, or alternatively may be deposited on the substrate 1 over one or more other layer(s) not shown.

Then, as shown in FIG. 3(b), a protective layer 17 is deposited on the substrate 1 over the DLC inclusive layer 11 (see step B in FIG. 4). Protective layer 17 may be deposited via sputtering, CVD, ion beam deposition, or any other suitable technique. In one example embodiment of this invention, protective layer 17 may be of or include amorphous silicon (a-Si). Optionally, when comprising a-Si, layer 17 may be deposited via DC sputtering using Ar gas and a Si target doped (e.g., with one or more of P, B, and/or Al, or any other suitable dopant) so as to be conductive. Thus, a-Si protective layer 17 may be doped in certain example embodiments of this invention, although it need not be doped in all embodiments of this invention. While layer 17 may comprise a-Si in certain embodiments (doped or intrinsic), this invention is not so limited. Alternatively, instead of a-Si, layer 17 may be of or include one or more of: silicon nitride, silicon oxide, silicon oxynitride, $BC_x$ (boron carbide where x is from 0.75 to 1.5), $TiC_x$ (titanium carbide, where x is from 0.47 to 0.99—this may be oxidation resistant), $HfC_x$ (hafnium carbide, where x is from 0.47 to 0.99), $Ti_xHf_yC$ (titanium hafnium carbide, where in certain non-limiting examples x may be about 0.6 and y may be about 0.4), $TaC_x$ (tantalum carbide, where x is from 0.47 to 0.99), $ZrC_x$ (zirconium carbide, where x is from 0.47 to 0.99), Cr, NiCr, $NiCrO_x$, Ti, a removable slurry of magnesium oxide, and/or $TiO_x$.

When protective layer 17 includes a carbide, it may be formed in one of many different ways. For example and without limitation, carbide layers 17 herein may be formed by depositing a carbide directly on the DLC inclusive layer 11. Alternatively, carbide layers 17 may be formed by depositing the metal (e.g., B, Ti, Hf, Ta, and/or Zr) via sputtering directly onto DLC inclusive layer 11 and then heating the same to form the carbide. The heating used in forming the carbide may be part of the heat treating for tempering, bending, or the like (i.e., during the ramp-up phase of HT when the temperature of the coated substrate is rising to tempering/bending levels); or alternatively the heating used to form the carbide may be a separate and distinct HT performed prior to the HT for tempering or the like. Thus, protective layer 17 may be formed before and/or during the HT for tempering or the like in different embodiments of this invention. The carbides may also be formed by any other suitable technique. Other suitable materials may also be used for layer 17 in different embodiments of this invention. In certain embodiments of this invention, protective layer 17 may be from about 5 to 500 Å thick, more preferably from about 5 to 100 Å thick, even more preferably from about 5 to 50 Å thick; and most preferably from about 5 to 20 Å thick. Layer 17 is preferably continuous, but need not be.

As shown in FIG. 3(c), the glass substrate 1 with at least layers 11 and 17 thereon, is then heat treated (HT) for purposes of thermal tempering, heat bending, heat strengthening, and/or the like (see step C in FIG. 4). At least part of this HT may be conducted, for example, in an atmosphere including oxygen at temperature(s) of from 550 to 800 degrees C., more preferably from 580 to 800 degrees C. (i.e., temperature(s) above the burn-off temperature of DLC). The HT may last for at least one minute, more preferably from 1-10 minutes, in certain example non-limiting embodiments of this invention. During HT, the presence of protective layer 17 protects DLC inclusive layer 11 from the HT and prevents layer 11 from burning off. While in some instances, some of layer 11 may still burn off during HT, most if not all of DLC inclusive layer 11 remains on the substrate 1 even after the HT due to the presence of protective layer 17. In example embodiments where layer 17 includes a-Si, the HT causes oxidation of at least some of the a-Si turning it to silicon oxide.

In certain embodiments, following the HT, the protective layer 17 may be removed (e.g., via known etching techniques and/or via ion beam milling using an ion beam source using a gas such as Ar) as shown in FIG. 3(d) (see step D in FIG. 4). However, this step is optional, as in other embodiments of this invention protective layer 17 is not removed and remains on the glass substrate 1 over the DLC inclusive layer 11 in the final product.

The scratch resistant heat treated glass substrate 1 (e.g., tempered and/or bent), with DLC inclusive layer 11 and optionally layer(s) 9 and/or 17 thereon, in accordance with the FIG. 1 or FIG. 2 embodiments of this invention, is then coupled to another substrate 3 in order to form a window product (see step E in FIG. 4). In the FIG. 1 embodiment, the substrate 1 with DLC inclusive layer 11 and optionally layer (s) 9 and/or 17 thereon is coupled to another substrate 3 via at least one seal and/or spacer 5 to form an IG unit. In the FIG. 2 embodiment, the substrate 1 with DLC inclusive layer 11 and optionally layer(s) 9 and/or 17 thereon is laminated to another substrate 3 via polymer inclusive interlayer 15 to form a vehicle windshield or the like. Alternatively, the HT substrate 1 with at least DLC inclusive layer 11 thereon need not be coupled to another substrate, and may be used in applications such as shower doors, glass table tops, vehicle windows, and/or the like.

As can be seen from the above, the instant inventions enables DLC to withstand HT, thereby enabling it to be used in HT applications where it previously could not be used.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The invention claimed is:

1. A method of making a coated article, the method comprising:
    forming a layer comprising diamond-like carbon (DLC) so as to be supported by at least a glass substrate,
    forming a layer comprising zirconium on the glass substrate over at least the layer comprising DLC,
    forming a solar control multi-layer coating including at least one layer comprising silver (Ag) and/or nickel chrome (NiCr) and at least one dielectric layer so as to be supported by the glass substrate, so that the solar control multi-layer coating and the layer comprising DLC are formed on opposite sides of the glass substrate, wherein the glass substrate supporting each of the solar control multi-layer coating, the layer comprising DLC, and the layer comprising zirconium is adapted to be heat treated.

2. The method of claim 1, wherein the layer comprising DLC is formed via an ion beam, and wherein carbon atoms thereof are subimplanted into the glass substrate via said ion beam.

3. The method of claim 1, wherein the layer comprising zirconium is at least partially formed on the glass substrate via sputtering.

4. The method of claim 1, wherein the layer comprising DLC comprises amorphous DLC and has more $sp^3$ carbon-carbon bonds than $sp^2$ carbon-carbon bonds.

5. The method of claim 1, wherein the layer comprising DLC has an average hardness of at least 10 GPa.

6. The method of claim 1, wherein the layer comprising zirconium comprises a carbide of Zr.

7. The method of claim 1, wherein the dielectric layer comprises zinc oxide.

8. The method of claim 1, wherein said solar control multi-layer coating includes at least one layer comprising silver.

9. The method of claim 1, further comprising heat treating the glass substrate supporting each of the solar control multi-layer coating, the layer comprising DLC, and the layer comprising zirconium.

* * * * *